United States Patent [19]

Anthony et al.

[11] Patent Number: 4,527,183
[45] Date of Patent: Jul. 2, 1985

[54] DRILLED, DIFFUSED RADIATION DETECTOR

[75] Inventors: Thomas R. Anthony, Schenectady; Douglas E. Houston, Liverpool; James A. Loughran, Scotia, all of N.Y.

[73] Assignee: General Electric Company, Schenectady, N.Y.

[21] Appl. No.: 282,218

[22] Filed: Jul. 10, 1981

[51] Int. Cl.³ .................. H01L 27/14; H01L 29/06
[52] U.S. Cl. .................................... 357/30; 357/32; 357/55; 357/88; 357/20; 357/31; 250/370
[58] Field of Search ............ 357/30, 32, 55, 88, 357/20, 31; 250/370 R

[56] References Cited

U.S. PATENT DOCUMENTS

| 3,372,070 | 3/1968 | Zuk | 357/88 |
| 3,748,549 | 7/1973 | Milch et al. | 357/31 |
| 4,010,487 | 3/1977 | Absalon et al. | 357/31 |
| 4,030,116 | 6/1977 | Blumenfeld | 357/88 |
| 4,110,122 | 8/1978 | Kaplow et al. | 357/30 |
| 4,227,942 | 10/1980 | Hall | 357/30 |

Primary Examiner—Andrew J. James
Assistant Examiner—Jerome Jackson
Attorney, Agent, or Firm—Paul E. Rochford; James C. Davis, Jr.; James Magee, Jr.

[57] ABSTRACT

A semiconductor device for the detection of radiation in general and X-radiation and infrared radiation in particular is provided.

4 Claims, 5 Drawing Figures

DRILLED, DIFFUSED RADIATION DETECTOR

CROSS-REFERENCE

The invention herein is related to the invention disclosed and claimed in U.S. patent application Ser. No. 267,235 filed May 26, 1981 in the names of the same inventive entity as the instant application, is assigned to the same assignee as the instant application, and is herein incorporated by reference.

FIELD OF THE INVENTION

This invention relates broadly to the semiconductor arts and more particularly to a semiconductor device for the detection of radiation in general and X-radiation and infrared radiation in particular.

BACKGROUND OF THE INVENTION

Shallow diode arrays made by diffusion or epitaxy techniques on the surface of a silicon wafer are currently used for imaging in the visible region (0.2–0.7 micron). In this wavelength range, the absorption constant, $\mu$, of silicon is high ($10^5$ cm$^{-1}$) so that 99% of the visible spectrum is absorbed in a shallow layer 0.46 micron thick contiguous to the incident surface. Thus shallow diodes extending to this depth will detect most of the electron-hole pairs generated by the visible light incident on the surface of a shallow diode array.

The high sensitivity of silicon vidicon targets in the visible region does not extend to X-ray and infrared (IR) radiation because of the low absorption constant of silicon for these types of radiation.

To achieve a high sensitivity for X-rays and IR, a thick silicon wafer can be used to compensate for the low absorption constant of silicon. With shallow diode arrays, however, a loss of resolution occurs in thick targets because electrons and holes diffuse out parallel to the surface of the target before they reach the shallow surface diodes from generation points deep in the target bulk. Moreover, because of the limited diffusion length of holes and electrons in silicon (150 microns in silicon with a minority carrier lifetime of 10 microseconds), many holes and electrons recombine before they ever reach the shallow surface diodes.

SUMMARY OF THE INVENTION

A semiconductor device for the detection of radiation in general and X-radiation and infrared radiation in particular is provided. The detector has a high sensitivity because the detecting junctions, which extend through the thickness of the detector, collect the holes and electrons generated deep in the target by the absorbed radiation before they have a chance to recombine. In addition, the detector has good resolution because the holes and electrons produced by the incident radiation are collected near their generation points before they have a chance to diffuse away from those points.

The radiation detector comprises a target of single crystal semiconductor material and an array of a plurality of diodes extending through the thickness dimension of the target. The target has first and second major opposed substantially parallel surfaces and an outer peripheral edge area which interconnects the major surfaces. A target axis passes through the centroid of the target substantially perpendicular to the major surfaces. The distance along the target axis between the major surfaces is the thickness of the target and is determined in accordance with the criteria set forth in the detailed description.

Each diode comprises, in combination, a high-aspect-ratio hole which extends through the thickness dimension of the target and a semiconducting region of generally uniform cross-section substantially concentric with the hole. Each hole has apertures lying in the planes of the major surfaces and an inner hole surface which interconnects the apertures. A hole axis passes substantially through the center of each aperture and is substantially parallel to the inner hole surface. Each hole axis may be substantially parallel to the target axis or, in another embodiment, the axis of each hole may intersect and form a predetermined angle with the target axis at a predetermined distance away from one of the major surfaces. The conductivity type of the semiconducting region is selected to be opposite to the conductivity type of the material of the target thus a junction, which is substantially concentric with the hole and extends between the major surfaces, is formed with the material of the target. Each semiconducting region is bounded by the inner surface of the hole and the junction.

The diodes in the array may be individually addressed by means of a rastering electron beam in which case the holes are filled with a vacuum-sustaining insulating substance. The effective addressing resistance may be descreased, and a larger number of diodes addressed, by the use of solid state addressing means. The solid state addressing means consist of a first group of parallel conductors overlying the top surface and a second set of parallel conductors overlying the bottom major surface which are orthogonal to the first set. The conductors of the first set and the conductors of the second set are in a preselected contacting relationship with the diodes of the array such that, with the addition of suitable solid state switches, each diode of the array may be individually addressed.

DETAILED DESCRIPTION OF THE INVENTION AND THE PREFERRED EMBODIMENTS

Figure 1:
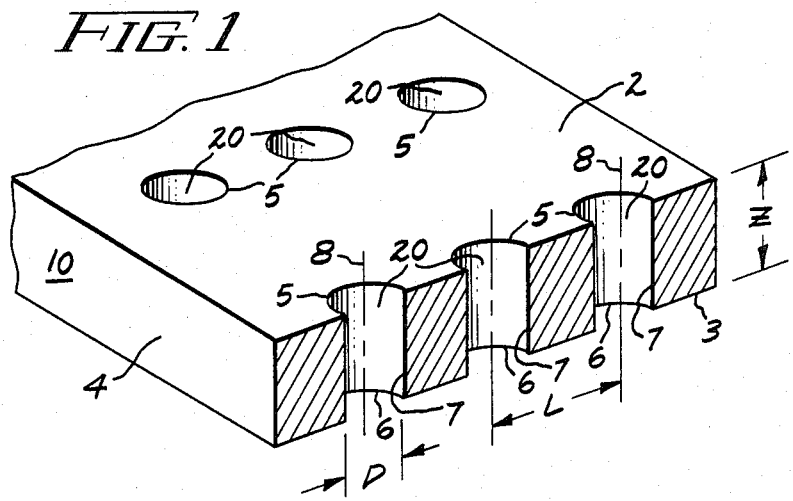
FIG. 1 is a schematic perspective representation in partial cross-section of a portion of a target of semiconductor material having a plurality of holes laser-drilled through the thickness of the target and arranged in an array.

With reference now to FIG. 1, the practice of this invention begins with the selection of a target 10 of the proper semiconducting material and thickness (Z). The specific geometry of target 10 will be determined by its end use and the selection parameters to be discussed below, but target 10 will have at least first (or top) 2 and second (or bottom) 3 major opposed surfaces and an outer peripheral edge area 4 interconnecting the major surfaces. The semiconducting material of target 10 may be selected from those which are known by the practitioners of the art of the construction of semiconductor or micro-electronic devices and include, for example, silicon, germanium, gallium arsenide, gallium phosphide, indium antimonide, cadmium telluride, and zinc sulfide. The material of target 10 is a single crystal, is without any preferred crystallographic orientation, and may have a conductivity type and/or impurity atom, i.e., dopant, concentration different from undoped semiconductor material.

Next, as disclosed and claimed in our above-referenced and incorporated U.S. patent application Ser. No. 267,325, holes (or, equivalently, bores) 20 are provided through target 10 by laser beam drilling. Holes 20 are interior lengthwise substantially cylindrical cavities having inner hole surfaces 7 interconnecting apertures 5 and 6 which lie in the planes of major surfaces 2 and 3, respectively. Hole axes 8 extend through the centers of apertures 5 and 6. Holes 20 preferably have a high-aspect-ratio, i.e., a length (also Z) to diameter (D) ratio greater than about 6. Using the laser drilling process disclosed in the Ser. No. 267,235 application, holes as small as about ¾ mil in diameter with axis 8-to-axis 8 spacings (L) as close as about 1.5D can be drilled through 12-mil thick silicon wafers by laser beam means without spalling, cracking, or introducing stresses or strains, i.e., damage, into the material of semiconductor target 10 adjacent to holes 20.

Figure 2:
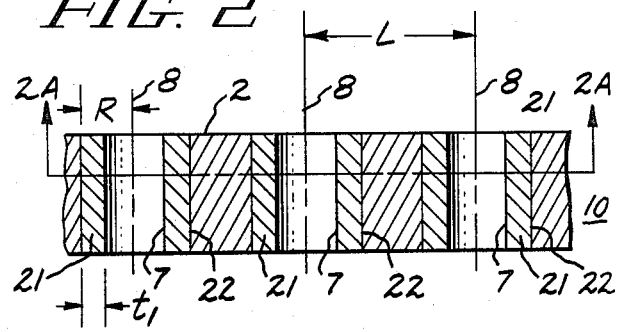
FIG. 2 is a schematic front view of the cross-sectioned face of the target of FIG. 1 following the formation of semiconductor regions concentric with the holes.
Figure 2A:
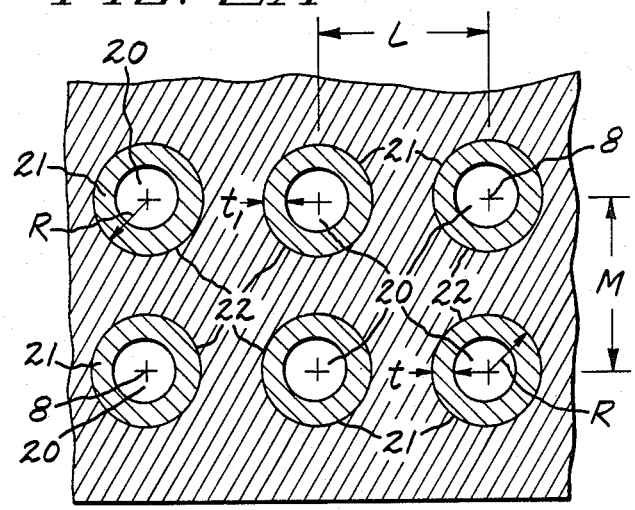
FIG. 2A is a schematic top view of the detector of FIG. 2 taken along plane 2A—2A of FIG. 2.

Following the formation of holes 20 in semiconductor target 10, target 10 is processed to form at least one semiconductor region 21 of generally uniform cross-section substantially concentric with each hole 20, as shown schematically in FIGS. 2 and 2A, for example, by introducing a first impurity into target 10 through inner surface 7 of each hole 20.

Semiconductor region 21 may have a conductivity type and/or impurity atom concentration (commonly measured in terms of resistivity) different from that of the semiconductor material of target 10. Regions 21 are bounded by inner hole surfaces 7 and interfaces 22 of area A with the material of target 10. Interfaces 22 are substantially concentric with holes 20 and are situated away from inner hole surfaces 7 by the distance (R), measured radially from hole axes 8 in FIGS. 2 and 2A, to which the impurity diffuses into target 10 from inner hole surfaces 7. If semiconductor regions 21 have a conductivity type opposite to that of target 10, interfaces 22 will be P-N junctions. The combination of hole 20 and semiconductor region 21 constitutes a drilled, diffused diode.

There are several techniques by which regions 21 may be made. One technique uses a relatively new solid state source of diffusable impurity called "spin-on" such as SpinRite ™ available from Diffusion Technology, Inc. of Sunnyvale, CA. Another technique, commonly practiced in the semiconductor arts, is the diffusion of an impurity in gaseous form for a preselected time at a preselected temperature.

Those skilled in the manufacture of semiconductor devices will recognize that unless special measures are taken, the impurity will also diffuse into the interior of target 10 from other exposed surfaces, e.g., surfaces 2 and 3. Growth of an oxide layer on a preselected surface or surfaces is one method by which diffusion from that surface may be prevented. Alternatively, sufficient amounts of target 10 underlying one or more surfaces, e.g., surfaces 2 and 3, containing the semiconductor regions may be removed, as by mechanical polishing.

In the radiation detectors of this invention, a plurality of holes 20 are arranged in an array. The array of FIG. 2A is typical and is a matrix array wherein a hole 20 is made at each intersection of a plurality of mutually orthogonal lines spaced apart by one distance (L) in one direction and by another distance (M) in the orthogonal direction. In the square matrix array of FIG. 2A, L and M are equal, but other patterns such as concentric circles of increasingly larger diameter are possible and are fully within the contemplation of this invention.

If the imaging target is being addressed by an electron beam in a vacuum, as is the case with some vidicons, the laser-drilled through-thickness holes must be filled, i.e. made vacuum-sustaining, after the impurity is diffused into the body. The filling and sealing of the holes of the array can be easily accomplished by painting on the surface of the body an insulating substance, e.g., silicone-polyimide liquid or an epoxy liquid that is drawn by capillary force into the holes where it is then cured in place. The advantages of the silicon-polyimide is that it will withstand high temperatures (500° C. for ½ hour in pure oxygen), and that it exhibits no outgassing once it is cured. The advantage of the epoxy is that it shows no discernible shrinkage on curing.

The appropriate target thickness (Z) required to detect X-rays, for example, is a function of several factors including the composition of the semiconductor material comprising target 10 and the percentage absorption that is required. Three commercial semiconductor materials suitable for use as target materials for X-ray detection are, for example, silicon, germanium and gallium arsenide.

The absorption of radiation in a target is a function of the thickness of the target, Z, the mass absorption coefficient of the material comprising the target, $\mu/\rho$, and the target density $\rho$ $$I(Z) = I_o \exp\left[-(\mu/\rho)\rho Z\right] \quad (1)$$

Equation (1) can be rearranged to give the target thickness Z needed to absorb $I/I_o$ fraction of the incident radiation.

$$Z = \frac{1}{\mu} \ln\left(\frac{I_o}{I}\right) \quad (2)$$

Table 1 gives the target thickness needed to absorb 90% of incident X-ray radiation with a wavelength of 0.4 micron, typical of the 30 kV radiation used in dental X-ray applications.

TABLE I

| Target Material | Density | Mass Absorption Coefficient | Thickness For 90 Percent Absorption |
|---|---|---|---|
| Silicon | 2.33 gm/cm$^3$ | 5 cm$^2$/gm | 0.189 cm (73 mils) |
| Germanium | 5.32 gm/cm$^3$ | 50 cm$^2$/gm | $8 \times 10^{-3}$ cm (3 mils) |
| Gallium Arsenide | 5.32 gm/cm$^3$ | 50 cm$^2$/gm | $8 \times 10^{-3}$ cm (3 mils) |

To absorb 99% instead of 90% of the incident X-ray radiation, the target thickness in Table I would have to be doubled.

Although the information in Table I favors germanium and gallium arsenide over silicon for use in imaging 30 kV radiation, many other technological and economic factors make silicon the preferred target material of the three. These factors include cost, the ability to produce additional circuitry on silicon, the ability to passivate silicon with its native oxide, and its widespread use.

A fraction f (90% in Table I) of the radiation impinging on target 10 will be photoelectrically absorbed. This fraction will increase with decreasing photon energy and increasing thickness of target 10 in the X-ray region of the spectrum. For a given incident flux $I_o$ in photons/cm²-sec, the number of electron-hole pairs produced in the target per diode per second is, $$N = (E/E_i) f I_o L^2 \qquad (3)$$

where E is the energy of the incident photons, $E_i$ is the energy required to produce a single electron-hole pair (3.6 eV for Si, 2.9 eV for Ge, 4.9 eV for GaAs) and L is the center-to-center spacing between drilled, diffused diodes in target 10.

Electron-hole pairs produced by the absorbed radiation diffuse randomly in regions 21 and 2 until they either recombine or they enter the depletion region (not shown) of the diode where they are separated and collected by junction 22 which is back-biased for the purpose of collecting and counting the electron pairs produced. The depletion regions will be concentric with junctions 22 and will have a width W, measured radially from hole axis 8, of which about W/2 will be situated in regions 21 with the other approximately W/2 situated across junctions 22 in the material of target 10. Because the semiconductor is selected to have a minority carrier diffusion length greater than diode spacing L, most of the electron-hole pairs generated by the incident radiation are detected by adjacent diodes. A small fraction of carriers diffuse to second nearest neighbors or recombine. The radiation intensity around each diode can be determined by measuring the change of its back-biased voltage with time. At time zero, a diode is addressed either by an electron beam or by solid state address lines and is back biased to a set voltage level. The effective charge Q stored by the diode in the back-biased state is $$Q > CV \qquad (4)$$

where C is the diode capacitance and V is the back-biased voltage. With the arrival of electron-hole pairs generated by radiation around the diode, the "diode capacitor" is discharged at a rate given by differentiating Eqn. 4 and combining it with Eqn. 3 to give $$\frac{dV}{dt} = 2q \frac{I_o}{C} \left( \frac{E}{E_i} \right) f L^2 \qquad (5)$$

where q is the charge of an electron. From Eqn. 5, the incident radiation intensity is, upon integration, $$\int I_o dt = \frac{C}{2 f L^2 q} \left( \frac{E_i}{E} \right) (V_o - V_f) \qquad (6)$$

where $V_o$ is the initial back-bias voltage given the diode on each target scan and $V_f$ is the final voltage the diode discharges to before a new refresh scan recharges the diode to a voltage $V_o$. Since the time between target scans is the same for all diodes, the spatial distribution of radiation intensity $I_o(x)$ impinging on the target is $$I_o(Z) = \frac{C}{2 T f L^2 q} \left( \frac{E_i}{E} \right) [V_o - V_f(Z)] \qquad (7)$$

where T is the time between each target scan.

High image contrast is obtained if a large number of electron-hole pairs are detected during each scan by diodes in the array and if the signal current I (Z) (Eqn. 7) is much greater than the reverse leakage current $I_R$ of the diode junction. The reverse current $I_R$ is given by the sum of the generation current $I_g$ produced by thermal excitation in the depletion region and the diffusion current $I_{diff}$ caused by diffusion of equilibrium minority carriers from the neutral regions into the depletion zone. At room temperature, the diffusion current can be ignored in Si and GaAs relative to the generation current whereas in Ge the generation current can be neglected in comparison to the diffusion current. For Si and GaAs, the generation current arising from the depletion region can be found from the effective carrier lifetime t in the reversed biased depletion region and the width W of the depletion region $$I_R = I_g = q \frac{N_i}{2t} WA \qquad (8)$$

where $N_i$ is the intrinsic carrier concentration, q is the electronic charge and A is the area of the P-N junction.

High image contrast results if the ratio of the current produced by the radiation $I_s$ to the intrinsic reverse current is large $$\frac{I_s}{I_R} = 2 \left( \frac{E}{E_i} \right) \frac{f I_o L^2 t}{n_i W A} \qquad (9)$$

Thus high image contrast in Si and GaAs is favored by high lifetime materials (large t), small depletion zone widths W (low reverse bias voltages) and small interfacial areas, A, of junctions 22 (drilled, diffused diode diameter as small as possible).

Equation (9) shows that there is a basic conflict between high contrast and high image resolution. To increase spatial resolution, the diode separation L must be decreased which decreases the image contrast. This conflict arises because the incident radiation generates a fixed number of electron-hole pairs per unit time. When this fixed number of pairs must be shared by an increasing number of diodes (better resolution) there are fewer pairs per diode (lower contrast).

Another factor that can limit target resolution is the lack of parallelism between major axes 8 of the diodes and the paths of the incident photons. For example, X-rays emitted from a source a distance Q away from a target having a radius P and thickness Z will have a maximum loss of resolution (Z/Q)P at the edge of the target. For a target 3 inches in diameter and a thickness of 0.073 inch, the maximum loss of resolution at the edge of the target is about 1 mil for a source to target distance Q of about 49 inches. By drilling the diodes at varying angles in the wafer, this loss of resolution caused by target-source geometry can be eliminated.

Figure 3:
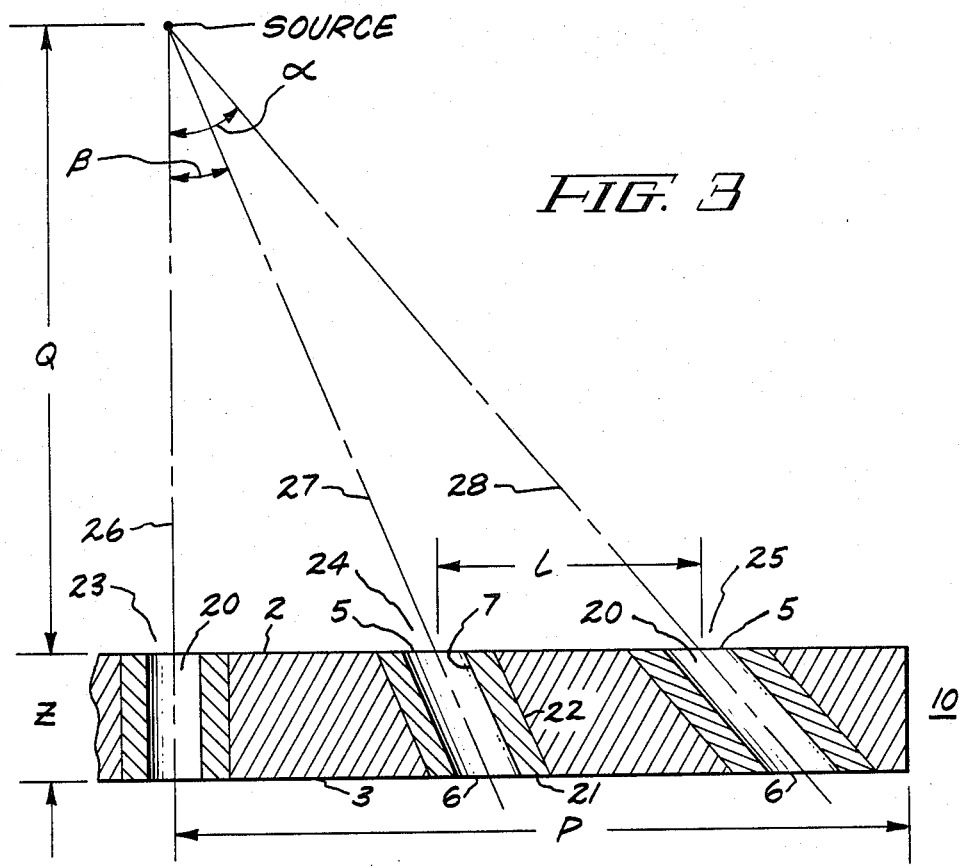
FIG. 3 is a partial schematic front view in cross-section of a radiation detector wherein the diodes are set at predetermined angles with respect to the target axis.

Such a configuration is shown schematically in FIG. 3 for three diodes only (23, 24, and 25) for simplicity of presentation. Axis 26 passes substantially through the centroid, but not necessarily a diode, of target 10 substantially perpendicular to major surfaces 2 and 3 and serves as the target axis. The diodes which are off-axis from target axis 26, e.g., 24 and 25, each comprise, in combination, a high-aspect-ratio hole 20 through the thickness dimension of target 20 and semiconducting regions 21 of generally uniform cross-section substantially concentric with holes 20. The angular tilt of other diodes not coincident with axis 26, e.g., 24 and 25, is measured by the angles, e.g., $\alpha$ and $\beta$, respectively, made between the axes passing through the centers of the other diodes, e.g., 27 and 28, respectively, and axis 26. Axes 27 and 28 pass substantially through the centers of apertures 5 and 6 which lie in the planes of major surfaces 2 and 3, respectively, and are substantially parallel to inner hole surfaces 7. In this embodiment, the hole axis-to-hole axis distance (L and M) is measured on top surface 2 between the points where adjacent axes (e.g., 27 and 28) pierce the plane of the top surface as is shown schematically in FIG. 3.

For high-energy X-rays, a more serious resolution problem is caused by coherent and incoherent (Compton) scattering of X-rays by light materials such as silicon. For 60 kV X-rays (medical type), only one half of the X-rays initially experience photo-electric absorption in silicon. The other half is first scattered, thus degrading the resolution of a silicon target. By limiting incoming radiation to lower-energy X-rays (<30 kV for silicon) or by using higher atomic number semiconductors (Ge or GaAs), the scattering and hence resolution problems disappear. Silicon targets therefore, for example, are most applicable for use as a detector for dental X-rays while GaAs or Ge, for example, should be used for medical X-ray applications such as in computed tomography (CT) diagnostic equipment.

Because of the capacitance of each drilled, diffused diode, the effective resistance $R_{eff}$ of any addressing scheme and the number $N_D$ of diodes in the array, the scan time T of the array must be greater than the natural relaxation time of the array or image distortion will result.

$$T \geq N_D R_{eff} C \qquad (10)$$

To avoid the perception of flicker of the image, the target must be scanned at least once every 1/10 sec (relaxation time of the human eye).

$$T \leq 1/10 \text{ sec} \qquad (11)$$

The combination of Eqns. (10) and (11) yield the condition $$N_D R_{eff} C \leq 1/10 \qquad (12)$$

The capacitance C of a drilled, diffused diode is given by $$C = \frac{k_s \epsilon_o \pi Z D'}{W} \qquad (13)$$

where Z is the target thickness (Eqn. 2), D' is the diameter of the drilled diffused diode (equal to D+2t, as shown on FIGS. 2 and 2A), W is the depletion zone width, $k_s$ is the dielectric constant and $\epsilon_o$ is the permittivity of the free space of hole 20.

The combination of Eqns. (12) and (13) give $$\frac{10 \pi N_D R_{eff} k_s \epsilon_o D' Z}{W} \leq 1 \qquad (14)$$

if we take typical values for silicon of $Z = 1.89 \times 10^{-1}$ cm (Table I), $D' = 2.5 \times 10^{-3}$ cm, $W = 1 \times 10^{-3}$ cm (10 volts reverse bias in 10 ohm-cm Si), $\epsilon = 8.86 \times 10^{-14}$ F/cm, $k_s = 11.7$ we find, $$N_D R_{eff} \leq 6.5 \times 10^{10} \text{ohms Silicon} \qquad (15)$$

For electron beam addressing, the effective addressing resistance $R_{eff}$ is $10^6$ ohms. Thus the maximum number of diodes in a single X-ray target array addressable by an electron beam is $6.5 \times 10^4$ or an array $250 \times 250$ (approximately conventional TV resolution).

Figure 4:
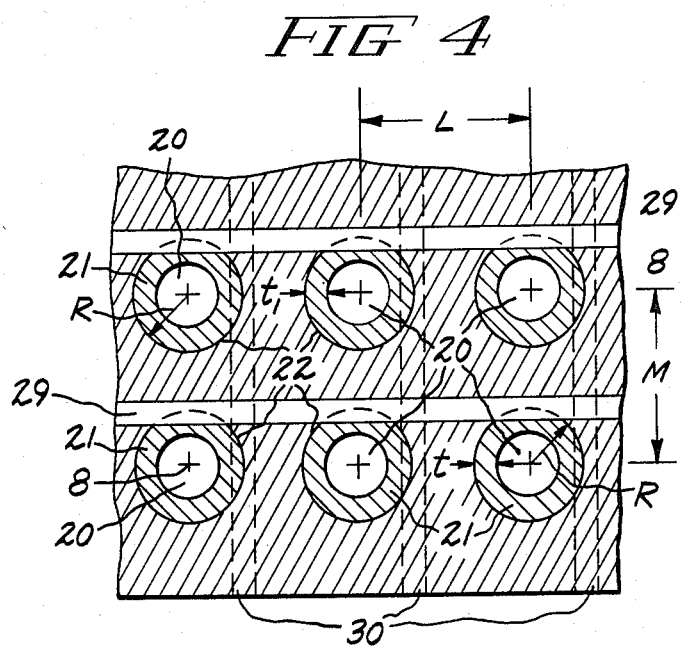
FIG. 4 is a top view of the detector of FIG. 2A schematically showing solid state addressing means.

For solid state addressing, however, the effective addressing resistance $R_{eff}$ is about $10^2$ ohms. This lower resistance allows the silicon target array to have up to $6.5 \times 10^8$ elements or an array $25,000 \times 25,000$ (i.e., a $50'' \times 50''$ target with 2 mil resolution. A system of solid state addressing is shown schematically in FIG. 4. A first plurality of substantially parallel conductors 29 is overlaid on the top major surface and a second plurality of substantially parallel conductors 30 is overlaid on the bottom major surface substantially orthogonal to the first plurality using conventional photolithographic techniques. Each conductor 29 of the first plurality and each conductor 30 of the second plurality is in a preselected contacting arrangment with at least one of the diodes of the array. In practice, for example, solid state switches will be provided using conventional means at each point of contact between conductors 29 and 30 to permit each diode, or selected sets of diodes, to be addressed individually or in groups, respectively.

Conventional technology dictates that the first plurality of conductors 29 and the second plurality of conductors 30 overlie the same surface. However, uniquely and advantageously, as disclosed in the above cross-referenced Ser. No. 267,235 application, the use of drilled, diffused diodes permits the use of one set of addressing lines on the top surface and another set of addressing lines on the bottom surface thereby minimizing or eliminating the interference, or cross-talk, experienced with some prior art devices when the addressing lines are run on one surface only.

With a given target scan time, the drilled, diffused diodes of the radiation detector of this invention allows a greater dynamic operating intensity range (more shades of grey) than is now possible with low capacitance surface diode arrays.

The radiation detector of this invention has been illustrated with respect to the detection of X-radiation and ultraviolet radiation. Those skilled in the art will recognize that the detector of this invention has wide potential for detecting radiation spanning the electromagnetic spectrum as well as energy emitted in the form of particles which possess mass and may or may not be charged. The use of the detector has been illustrated with respect to the imaging of dental X-rays, medical X-rays (as in computed tomography equipment) and ultraviolet radiation (as in geological studies from orbiting satellites). Those skilled in the art will appreciate the wide number of applications made possible by the novel detector of the invention and will further understand that the scope and spirit of the invention is limited only by the claims as set forth below.

We claim:

1. A radiation detector, said detector comprising
   (a) a target of single crystal semiconductor material, said target having first and second major opposed substantially parallel surfaces and an outer peripheral edge area interconnecting said major surfaces and a target axis, said target axis passing through the centroid of said target substantially perpendicular to said major surfaces, the distance along said target axis between said major surfaces being the predetermined thickness of said target;
   (b) an array of a plurality of diodes therethrough, each said diode comprising, in combination, a high-aspect-ratio hole through the thickness dimension of said target and a semiconducting region of generally uniform cross-section substantially concentric with said hole, each said hole having apertures lying in the planes of said major surfaces, an inner hole surface interconnecting said apertures and a hole axis passing substantially through the center of each aperture, each said hole axis intersecting and forming a predetermined angle with said target axis at a predetermined distance away from said upper surface, each said region having a conductivity type opposite to that of said target and being bounded by the inner surface of said hole and a junction with the material of said target, said junction being substantially concentric with said hole and extending between said major surfaces.

2. A radiation detector in accordance with claim 1 further comprising means for individually addressing each said diode.

3. A radiation detector in accordance with claim 1 wherein said semiconductor material of said target is one selected from the group comprising silicon, germanium, gallium arsenide, gallium phosphide, indium antimonide, cadmium telluride and zinc sulfide.

4. A radiation detector in accordance with claim 1 wherein each said hole is filled with a vacuum-sustaining insulating substance.

* * * * *